United States Patent [19]

Jost et al.

[11] Patent Number: 5,433,893
[45] Date of Patent: Jul. 18, 1995

[54] CONDUCTIVE COMPOSITIONS

[75] Inventors: Ernest M. Jost, Plainville, Mass.; Kirk McNeilly, Chepachet; Jay Gruskin, Albion, both of R.I.

[73] Assignee: Chemet Corporation, Attleboro, Mass.

[21] Appl. No.: 13,622

[22] Filed: Feb. 3, 1993

[51] Int. Cl.⁶ .................................................. H01B 1/02
[52] U.S. Cl. ........................................................ 252/514
[58] Field of Search ........................ 252/512, 514, 45

[56] References Cited

U.S. PATENT DOCUMENTS

| | | | |
|---|---|---|---|
| 3,067,053 | 12/1962 | Tarantino | 106/308 |
| 3,476,325 | 11/1969 | Groszek | 241/16 |
| 3,684,746 | 8/1972 | Juna et al. | 252/507 |
| 3,709,439 | 1/1973 | Tundermann et al. | 241/15 |
| 3,941,584 | 3/1976 | Tundermann et al. | 75/0.5 R |
| 3,992,212 | 11/1976 | Youtsey et al. | 252/514 |
| 4,088,801 | 5/1978 | Bolon et al. | 487/94 |
| 4,260,503 | 4/1981 | Michaelis | 252/48.6 |
| 4,273,583 | 6/1981 | Tyran | 75/251 |
| 4,463,030 | 7/1984 | Deffeyes et al. | 427/216 |
| 4,552,690 | 11/1985 | Ikeguchi et al. | 252/512 |
| 4,838,940 | 6/1989 | Kan et al. | 106/22 |
| 4,859,241 | 8/1989 | Grundy | 106/1.14 |
| 4,911,796 | 3/1990 | Reed | 204/15 |
| 5,180,523 | 1/1993 | Durand et al. | 252/512 |

FOREIGN PATENT DOCUMENTS 0081323 8/1983 European Pat. Off. .

*Primary Examiner*—Wayne Langel
*Attorney, Agent, or Firm*—Fish & Richardson

[57] ABSTRACT

An conductive composition includes noble metal (e,g,, gold) powder and/or flake at least partially coated with a thiol lubricant, A binder may be included to form a liquid or paste. The conductive composition may be made by milling a noble metal powder (e.g., gold) in the presence of a thiol lubricant.

32 Claims, No Drawings

CONDUCTIVE COMPOSITIONS

This invention relates to conductive compositions. Noble metal compositions, for example, may be used to lay down conductive pads and other features on a circuit board.

In one approach, a curable, noble metal paste or ink is applied by a silk screen process and allowed to cure. The paste or ink includes a noble metal filler, and a binder, which may be a curable or thermoplastic polymer or an inorganic, fusible glass.

Filler particles may be in powder, flake, or other form. Flakes are capable of yielding finished features of desirably low bulk resistivity and high coverage (surface area covered per unit weight of flakes).

Flakes (aspect ratio greater than one and typically six or higher) may be formed from powders (aspect ratio of about one; i.e., essentially spherical) by mechanically milling in, e.g., a ball mill. The metal is generally wet milled, in a solvent/lubricant vehicle, to prevent cold welding and formation of overly large flakes. Conventional milling vehicles include fatty acid lubricants dissolved or suspended in alcohol, aliphatic solvents, ketones, or glycols.

In the case of silver, fatty acid lubricants have a sufficiently strong chemisorption bond to the surface of the silver particles to keep them separated during milling.

Gold, on the other hand, is an extremely soft and malleable metal that does not readily form a protective oxide coating, leading to the propensity of gold to cold-weld and metallize during milling.

In general, in one aspect, the invention features a conductive composition comprising lubricated noble metal (e.g., gold) powder and/or noble metal flake (or a combination of the two) at least partially coated with a thiol lubricant.

Preferred embodiments include the following features. The thiol lubricant comprises a long-chain aliphatic thiol with a chain length of at least ten carbons, preferably in the range from dodecylthiol to tetracosylthiol, most preferably decaoctyl thiol.

The lubricant has a coverage of 3 to 200 milligrams per square meter. The ratio by weight of lubricant to gold is in the range of 1:10 to 1:200.

The lubricated noble metal powder or noble metal flake has an aspect ratio larger than one; a mean flake size of from 0.5 to 20 microns in the longest dimension; surface areas in the range of 0.1 to 3.0 square meters per gram; and a TAP density of at least about 3.0, preferably at least 6.0 g/cc.

The composition may include a binder to yield a paste or liquid. The binder may be a curable or thermoplastic polymer or an inorganic, fusible glass, e.g., a thermoset epoxy, preferably diglycidyl ethers of bisphenol A (DGEBA) or of novolac resins.

The overall composition may have at least about 75 percent and preferably at least 79 percent by weight of noble metal after curing; a volume resistivity of less than $1 \times 10^{-3}$ ohm-cm in a 1.5 mil thick layer; and rheology properties which permit a line resolution of better than 100 microns when automatically dispensed on a surface. For example, the viscosity may be between 3,000 and 40,000 CPS at a shear rate of 19.2/sec and increasing as the shear rate decreases to 1.9/sec. The thixotropy index under these conditions is in the range 4.5 to 6.0.

In general, in another aspect, the invention features a method of making a conductive composition comprising milling a noble metal powder (e.g., gold) in the presence of a thiol lubricant.

Preferred embodiments include the following features. The thiol lubricant is dispersed in an organic solvent, preferably a glycol. The ratio by weight of thiol lubricant to organic solvent is in the range of 1:10 to 1:100. The milling proceeds for a period of from 1 to 4 hours. The ratio by weight of lubricant to gold is in the range of 1:10 to 1:200. The ratio by weight of lubricant to solvent is in the range of 1:1 to 1:400. The ratio by weight of solvent to noble metal is in the range of 1:4 to 10:1.

Among the advantages of the invention are the following.

The thiol coated powder or flake is easily dispersed at high loading ratio in conventional organic and aqueous vehicles. Inks using the coated powder or flake have low viscosity at high metal loadings leading to high thermal and electrical conductivity. The inks also have suitable viscoelastic (rheological) properties of high thixotropy and yield stress which allows screen printing and dispensing in automated equipment such as screen printers and ink-jet and ink-dot dispensers at high line resolutions of at least 100 microns. Traditional gold powders and flakes have viscosities several times higher (greater than 50,000 CPS), and lower thixotropy, in the range of 1.0 to 2.0 when used at comparable metal loadings.

The thiol lubricant has an adequately weak bonding to the surface of the powder or flake to permit excess lubricant to be cleaned away, which is useful for effective curing of the epoxy or other binding material used to form the ink.

Before proceeding to additional description and examples, we first define several terms.

Noble metal powder is a particulate material that has not gone through a mechanical or milling process and is not coated with a lubricant.

Lubricated noble metal powder is a noble metal powder whose surface is coated with a lubricant.

Noble metal flake is a material that typically has gone through a mechanical or milling process in the presence of a lubricant, retains a coating of the lubricant, and has an aspect ratio greater than one, i.e., the ratio of the widest dimension of a typical particle to the smallest dimension of that particle.

Particle size is the mean particle size as measured by a particle size analyzer such as the Microtrac Particle Analyzer made by Leeds and Northrup.

Conductivity refers to electrical as well as thermal conductivity,

Milling is an intensive mixing process capable of breaking up particulate agglomerates, dispersing a lubricant uniformly on a suspended powder, or flattening or otherwise deforming particles or agglomerates.

TAP density is mass per unit volume measured after performing a number of taps to a cylindrical column of powder using an instrument such as a Tap-Pak volumeter. All TAP densities reported were determined by ASTM method B527-85.

Thixotropic index is the ratio of viscosity at a shear rate of 1.92/sec to the viscosity at a shear rate of 19.2/second.

Viscosities are given at a shear rate of 19.2/second (5 rpm) on a Brookfield HBT cone/plate viscometer (spindle CP-51). Viscosities are expressed in units of centipoise (cPs).

In the invention, noble metal flake is formed by milling noble metal powder in the presence of a thiol lubricant. The resulting thiol coated flake (of the thiol lubricated noble metal powder) is mixed with a binder to make a liquid or paste.

The liquid or paste, after curing, preferably has a volume resistivity of less than $1 \times 10^{-3}$ ohm-cm. Lower volume resistivities can be achieved by prolonging the curing time at higher temperatures or by increasing the weight content of gold in the paste. Much lower volume resistivities are achieved in inorganic systems with binders such as high lead borate glass frit. These systems have the additional advantage of high temperature resistance. Lubricant The term thiol refers to organic compounds which include an -SH group, also known as hydrosulfides and mercaptans. Among these, aliphatic thiols are preferred, preferably those having a chain length of ten carbon atoms or more.

Preferred thiol lubricants range from dodecylthiol to tetracosylthiol:

R-SH where $R=C_{12}H_{25}$ through $C_{24}H_{49}$ A particularly preferred thiol is decaoctyl thiol. Lubricants are usually strongly adsorbed or chemisorbed with energies in excess of 50 kJ/mol. Adsorption is the condensation of gases, liquids or dissolved substances on a solid surface.

Solubility of the lubricant in the solvent is not a prerequisite and consequently many organic and inorganic solvents such as alcohols, ketones and water are suitable. The lubricant is preferably dispersed in an organic solvent, preferably a glycol, in a weight ratio of from about 1:1 to 1:400.

Noble Metal

Most commercially available gold powders are suitable for use in the invention. Preferred powders have a surface area of 0.1 to 1.3 m²/g and a mean particle size of 0.5 to 10 micron. The TAP density should be greater than 3 g/cm³, preferably greater than 6 g/cm³. Preferred powders include spherical gold powders available from Chemet such as G-004.

The gold flake is preferably produced by wet milling the gold powder in the lubricant solution, using from about 25 to 100 ml. solution per 100 grams gold powder. The powder is preferably milled in the solution for 1-4 hours and the temperature of the powder and solution maintained at room temperature or below. The temperature of the powder is controlled by providing the mill with a cooling jacket. Wet milling may be accomplished by a ball or attritor mill, typically containing a number of steel balls although glass or ceramic balls will give similar results. For a 750 cm³ Union Process attritor mill, the preferred rotation speed is from about 300 to 400 rpm. The milling may be performed with other types of mixers, including radial or axial type stirrer, high speed homogenizer, or ultrasonic disperser.

After milling, the gold in flake form is rinsed to remove excess lubricant, e.g. with organic solvents (such as acetone, ethanol, MEK, ethylacetate, etc.), air dried, and screened to a desired particle size.

Binder

The resulting gold flake (or the thiol lubricated powder) is suitable for use in any conductive adhesive or ink, including but not limited to epoxies, polyimides and glass frits. A particularly preferred epoxy composition includes DGEBA or a novolac resin. It is preferred that the conductive composition, after hardening by drying, curing or firing (depending on the nature of the composition), contain at least about 75 and preferably at least about 79 weight percent gold. It is further preferred that the composition contain a sufficient loading of gold to provide, after hardening, a volume resistivity of less than about $1 \times 10^{-3}$ ohm-cm in a 1.5 mil layer.

Example 1

Add 35.0 grams of a 2.6 micron spherical gold powder (Metalor #458), 0.7 grams oleic acid with 17 ml. of methanol into a suitably sized attritor mill containing 240 grams steel balls (3/32" diameter). Mill the gold powder at $-10°$ C. (with coolant through a jacket) at a speed of 360 rpm for 1 hour. After milling, the gold flake is washed free of excess lubricant with several methanol washes. The moist powder is air dried and then screened through a 325 mesh screen. The resultant powder has a TAP density of 3.2 g/cm³ and is not significantly changed in appearance. When mixed into a paste using a standard epoxy resin, the maximum loading obtained was 72% gold powder; the viscosity of this paste is 60,000 centipoise. Curing at 150° C. for one hour a 1.5 mil layer of ink gives a dull brown film with a volume resistivity of $42.4 \times 10^{-4}$ ohm-cm.

Example 2

Add 25.0 grams of a 3.1 micron spherical gold powder (Metalor #458), 0.5 grams decaoctyl thiol dissolved in 14 ml. of ethylene glycol to an attritor with steel balls as in Example 1. Mill the gold powder for 1 hour at a speed of 360 rpm and maintain the temperature of the milling mixture at $-10°$ C. (with jacket). After discharging the powder, remove excess lubricant with several methanol washes. Allow the moist powder to air dry, then screen through a 325 mesh sieve. The final flake is significantly denser with a TAP density of 7.0 gm./cm³ is much finer than the starting powder. This flake gave a loading of 87.5% gold, using a different epoxy resin and a viscosity of 17,000 centipoise. Upon curing, this gold ink gave a much more conductive film (metallic appearance) with a volume resistivity of $1.0 \times 10^{-4}$ ohm-cm.

Example 3

Add 25.0 grams of a 2.6 micron gold powder (Chemet #0004), 0.5 grams n-dodecyl thiol dissolved in 15 ml. ethylene glycol to an attritor as in Example 1. Mill the gold powder for 1 hour at 360 rpm, maintaining the temperature of the mixture at 53° F. through a cold water jacket. After milling, discharge the wet flake and remove excess lubricant by several methanol baths. Allow flake to air dray and screen through a 325 mesh sieve. The resulting gold flake had a TAP density of 8.9 gm/cc. This gold flake was loaded into the same epoxy resin as Example #2 at a loading of 87.5%. The resulting ink had a viscosity of 11,000 centipoise and a volume resistivity of $7.9 \times 10^{-5}$ ohm/cm when cured in a 1.5 ml. film.

Other embodiments are within the following claims.
What is claimed is:

1. A conductive composition comprising lubricated gold particles at least partially coated with a thiol lubricant.

2. The composition of claim 1 wherein said thiol has a chain length of at least ten carbons.

3. The composition of claim 1 wherein said thiol lubricant contains between 12 and 24 carbon atoms, inclusive.

4. The composition of claim 1 wherein the lubricant has a coverage of 3 to 200 milligrams per square meter.

5. The composition of claim 1 wherein the ratio by weight of lubricant to gold is in the range of 1:10 to 1:200.

6. The composition of claim 1 wherein said lubricated gold particles have an aspect ratio larger than one, and a mean particle size of from 0.5 to 20 microns in the longest dimension.

7. The composition of claim 1 wherein said lubricated gold particles have a surface area in the range of 0.1 to 3.0 square meters per gram.

8. The composition of claim 1 wherein said lubricated gold particles have a TAP density of at least about 3.0 gms/cm$^3$.

9. The composition of claim 1 further comprising a binder, the composition having the form of a paste or liquid.

10. The composition of claim 9 wherein said binder comprises a curable or thermoplastic polymer or an inorganic, fusible glass.

11. The composition of claim 9 comprising at least about 75 percent by weight of gold after curing.

12. The composition of claim 9 wherein said binder comprises a thermoset epoxy.

13. The composition of claim 9 having a volume resistivity of less than $1 \times 10^{-3}$ ohm-cm in a 1.5 mil thick layer, and rheology properties to permit a line resolution of better than 100 microns when automatically dispensed on a surface.

14. The composition of claim 13 having a viscosity of between 3000 and 40,000 CPS.

15. The composition of claim 13 having a thixotropic index in the range 2.5 to 6.5.

16. The composition of claim 1 wherein said thiol lubricant comprises decaoctyl thiol.

17. The composition of claim 9 comprising at least 79 percent by weight of gold after curing.

18. The composition of claim 12 wherein said thermoset epoxy comprises diglycidyl ethers of bisphenol A (DGEBA) or of novolac resins.

19. The composition of claim 13 having a thixotropic index in the range 4.5 to 6.0.

20. The composition of claim 1 wherein said gold particles are in the form of gold powder, gold flakes, or a combination thereof.

21. The composition of claim 1 wherein said lubricated gold particles have a TAP density of at least about 6.0 gms/cm$^3$.

22. A conductive composition comprising gold flake having an aspect ratio greater than one and a flake size of from 0.5 to 20 microns in the longest dimension, the gold flake being at least partially coated with an aliphatic thiol lubricant having a chain length of at least ten carbons.

23. The composition of claim 22 further comprising a binder.

24. A method of making a conductive composition comprising:
   milling a gold powder in the presence of a thiol lubricant.

25. The method of claim 24 wherein the thiol lubricant is dispersed in an organic solvent.

26. The method of claim 25 wherein the solvent comprises a glycol.

27. The method of claim 25 wherein the ratio by weight of thiol lubricant to organic solvent is in the range of 1:10 to 1:100.

28. The method of claim 25 wherein said milling proceeds for a period of from 1 to 4 hours.

29. The method of claim 25 wherein the ratio by weight of lubricant to gold is in the range of 1:10 to 1:200.

30. The method of claim 25 wherein the ratio by weight of lubricant to solvent is in the range of 1:1 to 1:400.

31. The method of claim 25 wherein the ratio by weight of solvent to gold is in the range of 1:4 to 10:1.

32. The method of claim 25 further comprising
   mixing the milled gold with a binder to form a liquid or paste.

* * * * *

UNITED STATES PATENT AND TRADEMARK OFFICE
CERTIFICATE OF CORRECTION

PATENT NO.    : 5,433,893

DATED         : July 18, 1995

INVENTOR(S)   : Ernest M. Jost et al.

It is certified that error appears in the above-identified patent and that said Letters Patent is hereby corrected as shown below:

On the title page,
item [57], Abstract line 3, after "lubricant", the comma should be a period.

Col. 3, line 2, "(cPs)" should be --(CPS)--.

Col. 3, line 16, after "resistance", start a new paragraph and center "Lubricant".

Col. 3, line 26, after "$C_{24}H_{49}$" start a new paragraph.

Col. 4, line 57, "dray" should be "dry".

Signed and Sealed this

First Day of October, 1996

Attest:

BRUCE LEHMAN

Attesting Officer    Commissioner of Patents and Trademarks